United States Patent [19]
Kazerounian et al.

[11] Patent Number: 5,732,015
[45] Date of Patent: Mar. 24, 1998

[54] SRAM WITH A PROGRAMMABLE REFERENCE VOLTAGE

[75] Inventors: Reza Kazerounian, Alameda, Calif.; Boaz Eitan, Sunnyvale, Calif.

[73] Assignee: WaferScale Integration, Inc., Fremont, Calif.

[21] Appl. No.: 690,133

[22] Filed: Apr. 23, 1991

[51] Int. Cl.$^6$ ............................................. G11C 5/00
[52] U.S. Cl. ................ 365/154; 365/156; 365/189.09; 365/208
[58] Field of Search ........................ 365/156, 154, 365/207, 208, 189.09

[56] References Cited

U.S. PATENT DOCUMENTS

| | | | |
|---|---|---|---|
| 4,404,653 | 9/1983 | Ruhman et al | 365/154 |
| 4,441,168 | 4/1984 | Luciw | 365/154 |
| 4,459,683 | 7/1984 | Yalamanchici et al | 365/154 |
| 4,764,897 | 8/1988 | Kameyama et al | 365/190 |
| 4,764,899 | 8/1988 | Lewallen et al | 365/190 |
| 4,799,194 | 1/1989 | Arakawa | 365/190 |
| 4,901,279 | 2/1990 | Plass | 365/154 |
| 4,933,903 | 6/1990 | Nakaizumi | 365/154 |

OTHER PUBLICATIONS

P. Richman, "MOS Field Effect Transistors and Integrated Circuits", ©1973 John Wiley & Sons, INC., 17–25.TK 7871.85R466 .

Primary Examiner—Joseph E. Clawson, Jr
Attorney, Agent, or Firm—Skjerven, Morrill, MacPherson, Franklin & Friel LLP

[57] ABSTRACT

The leakage current through a static random access memory ("SRAM") containing a plurality of memory cells connected between a voltage supply and a reference voltage, wherein each memory cell uses native transistors as load elements, is controlled by controlling the reference voltage.

5 Claims, 6 Drawing Sheets

SRAM WITH A PROGRAMMABLE REFERENCE VOLTAGE

FIELD OF THE INVENTION

This invention relates to static RAM's and in particular to a static RAM with a load possessing a programmable current.

BACKGROUND OF THE INVENTION

Static RAM's (SRAM's) are well known in the art. FIG. 1 illustrates a prior art static RAM wherein complementary MOS transistors are used to form the SRAM cell. FIG. 1 illustrates a traditional six (6) transistor cell consisting of 4 transistors making up the active latch (P-type transistors P1 and P2 and N-type transistors N1 and N2 connected in a standard cross-coupled latching configuration) and pass transistors Q1 and Q2 for passing signals on bit lines BL and $\overline{BL}$, respectively, to either set or read the state of the latch. The operation of this circuit is well known and thus will not be described here. However, one limitation of the cell of FIG. 1 is that it requires a large semiconductor area and thus limits the size of an array constructed using this cell. The large size is caused by the need for P and N wells for the CMOS technology used in the cell's fabrication and from the fact that six (6) metal pitches are required to interconnect the various transistors to form the operative cell. The main advantages of the cell are that it has zero standby power, being fabricated using CMOS technology, and also has very good soft error immunity (i.e., good immunity to alpha particle radiation).

FIG. 2 illustrates one circuit that was developed to reduce the size of the SRAM cell shown in FIG. 1. In FIG. 2, the P-type transistors P1 and P2 of FIG. 1 have been replaced with polycrystalline silicon load resistors R1 and R2. The removal of the P-type transistors, P1 and P2, reduces the size required for the N well in which the P type transistors would be formed and allows the polycrystalline silicon resistors to be directly connected to nodes A and B through buried contacts of a type well known in the semiconductor arts. This cell uses four (4) transistors, namely N-type transistors N1 and N2 which in combination with load resistors R1 and R2 form the latch portion of the cell and pass transistors Q1 and Q2 which again allow the state of the latch to be either changed or read as appropriate. In FIGS. 1 and 2, pass transistors Q1 and Q2 are always N-channel enhancement mode devices such that for zero voltage on the word line WL, transistors Q1 and Q2 are "off" and pass essentially no leakage current. Zero leakage through transistors Q1 and Q2 is required to ensure that the state of the latch is not changed during the times between either reading its state or changing its state.

In the fabrication of the structure of FIG. 2, a first layer of polycrystalline silicon is typically used to fabricate the gate electrodes for transistors N1 and N2 and Q1 and Q2 and a second layer of polycrystalline silicon is used to fabricate polycrystalline silicon load resistors R1 and R2. Polycrystalline silicon load resistors R1 and R2 require a carefully controlled resistivity. If their resistivity is too low then too much current flows through these transistors, thereby consuming too much power in the cell, and the array fabricated from the cells will not meet the standby power requirement for the array. Too high a resistivity for these load resistors means that the leakage current from $V_{CC}$ to nodes A and B is not high enough to balance the depletion in charge from nodes A and B as a result of leakage current from these nodes to the substrate or through transistors N1 and N2 to ground.

In this situation, the current through polycrystalline load resistors R1 and R2 is not sufficient to maintain either node A or node B at its required state with the result that the high node drops in voltage and the cell loses its state.

Moreover, in the fabrication of the structure of FIG. 2, the leakage currents associated with nodes A and B might vary in one direction because of a statistical variation in the process steps used to fabricate the source and drain regions of transistors N1 and N2 and the associated interconnects, and the characteristics of the polycrystalline load resistors R1 and R2 can deviate in the opposite direction as a result of the typical variations in the process steps used to fabricate the polycrystalline silicon load resistors R1 and R2. Accordingly, errors in the formation of the polycrystalline silicon load resistors R1 and R2 might cause a variation of leakage current through these load resistors in exactly the opposite direction from that required to compensate for leakage from nodes A and B.

As the array of static RAM cells becomes larger, the leakage current associated with each cell must become smaller to maintain the total leakage for the array constant and within specification. However, as the total leakage per cell decreases, in order to maintain the array leakage within acceptable limits, the sensitivity of the cell to soft error increases. To resolve this problem, the polycrystalline silicon load resistors R1 and R2 were replaced by N-type load transistors. See ig. "A Subthreshold Load Element for High Density Static RAM" by K. L. Wang et al., pp. 628–631, IEDM (1982). These load transistors are native devices (i.e. these transistors have no channel implants), provide a high current when "on" and a low current when "off" and give some control, therefore, to the amount of leakage current through the array when the array is inactive, and at the same time improve dramatically the soft error immunity. One disadvantage of this solution is that the process is much more complicated and no longer is a standard generic SRAM process. The integration of the SRAM process with the standard CMOS process has been possible only with the six (6) transistor cell shown in FIG. 1 because the other cells described above in conjunction with FIG. 2 are too complicated compared to the standard CMOS processing. The standard CMOS process is mainly used to fabricate other types of circuitry (such as, a microprocessor or an EPROM) with which the SRAM is intended to operate on the same chip.

Accordingly, there is a need for an improved SRAM cell which is capable of achieving low leakage currents, immunity to soft error, high density, and which is fabricated by a process compatible with the CMOS processes used to fabricate the circuitry used in microprocessors and non-volatile memories. Thus the SRAM of this invention is capable of being fabricated on the same chip using the same process as used for the majority of the chip.

SUMMARY OF THE INVENTION

In accordance with this invention, an SRAM cell is provided which overcomes many of the disadvantages of the prior art SRAM cells by utilizing a load which is programmable to provide a desired leakage current. The SRAM loads of this invention are programmable upon completion of the manufacture of the memory array so as to allow the performance of the memory array to be adjusted as desired.

In one embodiment of this invention, the SRAM comprises six (6) transistors, just as a standard six (6) transistor cell, with, however, the leakage current of two of the six (6) transistors being programmable following manufacture to adjust the turn-on voltages and the impedances provided by the two (2) transistors which function as load transistors.

This invention will be more fully understood in conjunction with the following detailed description taken together with the following drawings.

DETAILED DESCRIPTION

The following description is meant to be illustrative only and not limiting. Those skilled in the art will be able to fabricate other circuits in accordance with this invention based on the following description.

Figure 1:
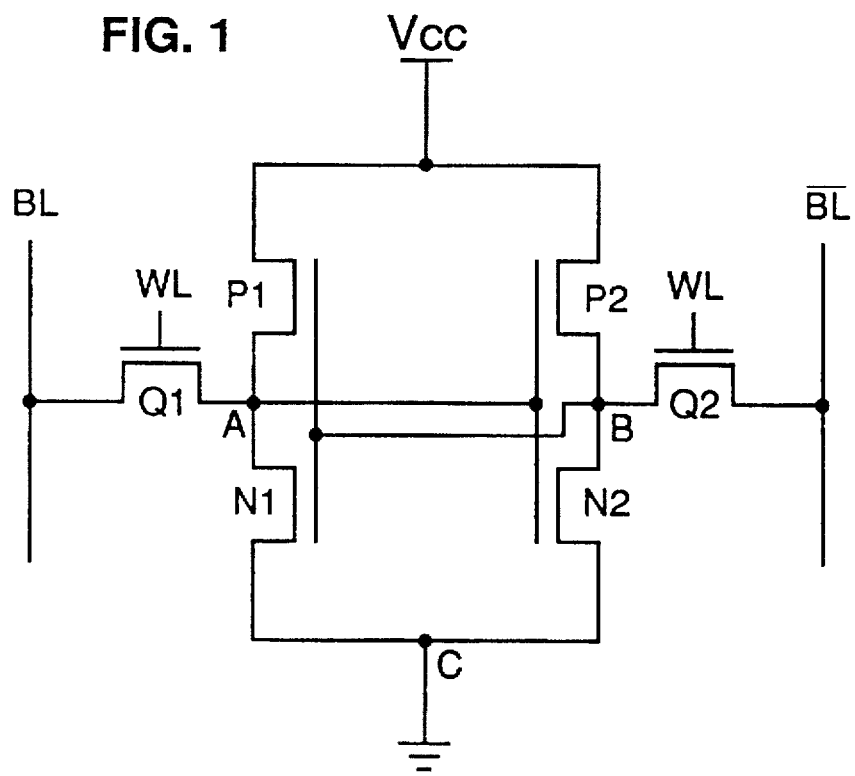
FIG. 1 illustrates a prior art SRAM utilizing a standard latch using CMOS transistors P1, P2, N1 and N2.
Figure 2:
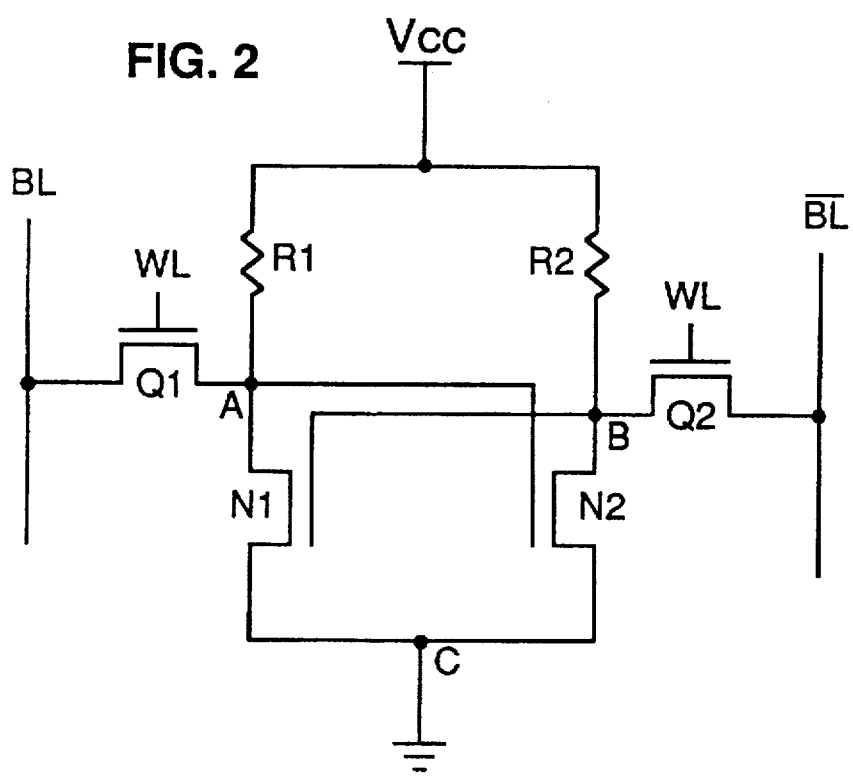
FIG. 2 illustrates a prior art SRAM circuit utilizing polycrystalline silicon load resistors R1 and R2 together with N-channel transistors N1 and N2.
Figure 3:
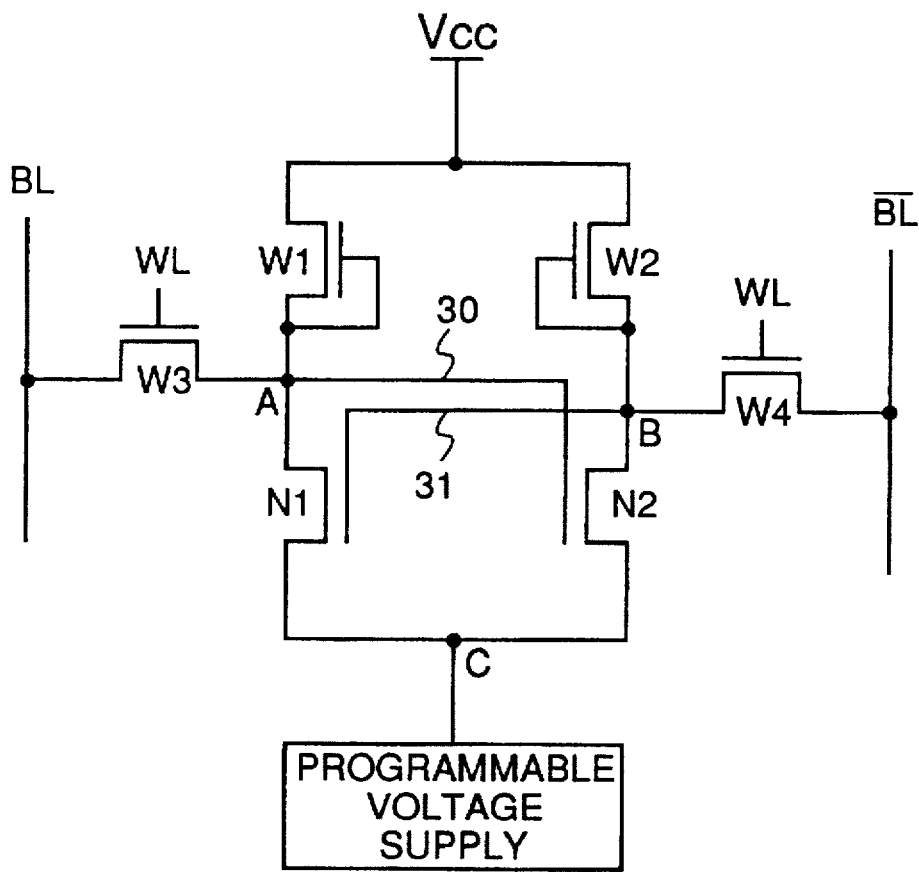
FIG. 3 illustrates the SRAM of this invention utilizing six (6) transistors, four (4) of which (transistors W1, W2, W3, and W4) have one of their voltages programmable to provide the SRAM with the desired performance characteristics.

FIG. 3 illustrates the programmable SRAM cell of this invention. The structure of FIG. 3 is fabricated using N-channel devices for transistors W1, W2, W3, and W4. The use of N-channel transistors eliminates the need for an N well to contain P-type load transistors, as shown in FIG. 1, thereby saving space.

In FIG. 3, programmable load transistors W1 and W2 are interconnected with N-channel transistors N1 and N2 to form a latch circuit of a type well known in the art. In the structure of FIG. 3, the voltage on node A is applied to the gate of transistor N2 by means of interconnect structure 30 and the voltage on node B is applied to the gate of transistor N1 by interconnect structure 31. Interconnect structures 30 and 31 can be any type of interconnect structure known in the art such as a metal interconnect, a silicide interconnect, or a polycrystalline silicon interconnect selectively doped to provide the desired conductivity. Preferably, interconnects 30 and 31 are formed of polycrystalline silicon utilizing buried contacts to nodes A and B.

The leakage currents of load transistors W1 and W2 are programmable in accordance with this invention in a manner which will be explained below in detail. Pass transistors W3 and W4 are controlled by the voltage on the word line WL to either "off" (i.e. non-conducting) or "on" (i.e. conducting), thereby allowing the signals on nodes A and B to be detected and transmitted on bit lines BL and $\overline{BL}$, respectively, to a sense amplifier. Alternatively, the signals on bit lines BL and $\overline{BL}$ are passed through pass transistors W3 and W4 to nodes A and B to set the state of the memory cell in a standard, well-known manner.

Figure 4:
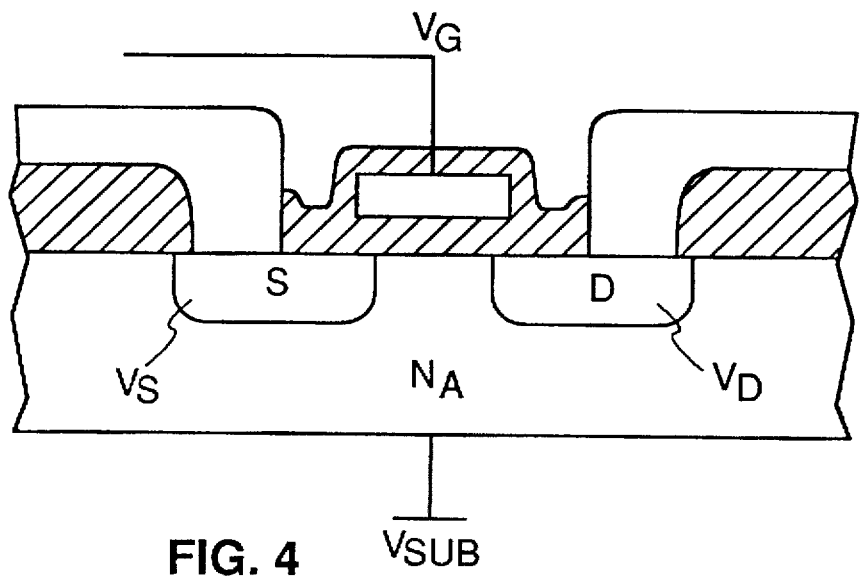
FIG. 4 shows in cross section the substrate and gate regions of a typical MOS transistor used in FIG. 3.

FIG. 4 shows in cross section the substrate, source, drain and gate regions of a typical MOS transistor such as any one of transistors N1, N2, W1, W2, W3 and W4 used in FIG. 3. The voltage applied to the source S is denoted $V_S$, the voltage applied to the drain D is denoted $V_D$, and the voltage applied to the substrate is $V_{SUB}$. The source and drain regions of an N-channel transistor contain donor impurities, the concentration of which is denoted $N_D$. For typical (one) 1 micron technology, an enhancement device will have an acceptor impurity concentration $N_A$ in the substrate equal to approximately $5 \times 10^{16}$ atoms/cc. The substrate of an N-channel transistor contains acceptor impurities as the majority carriers. The voltage drive applied to the transistor from gate to source is called the gate drive and is denoted by the difference between the voltage $V_G$ applied to the gate and the voltage $V_S$ applied to the source. Thus, the gate drive $V_{GS}$ is given by the following equation:

$$V_{GS} = V_G - V_S \qquad (1)$$

The back bias $V_{BS}$ applied to the transistor is given by the substrate voltage $V_{SUB}$ minus the source voltage $V_S$. Thus, the back bias $V_{BS}$ is given by the following equation:

$$V_{BS} = V_{SUB} - V_S \qquad (2)$$

The transistor drive from drain to source is given by the difference between the drain voltage $V_D$ and the source voltage $V_S$. Thus, the drain drive $V_{DS}$ is given by the following equation:

$$V_{DS} = V_D - V_S \qquad (3)$$

Equations 1, 2, and 3 are defined, respectively, as the gate drive $V_{GS}$, the back bias $V_{BS}$, and the drain drive $V_{DS}$ associated with the N-channel transistors used in the SRAM circuit shown in FIG. 3.

The threshold voltage $V_T$ of the transistor is the voltage at which the transistor turns from non-conducting to conducting. This voltage is a function of $V_{BS}$, $N_A$ and $L_{eff}$ for short channel devices where $L_{eff}$ is the effective channel length. The effective channel length $L_{eff}$ is slightly shorter than the drawn channel length $L_{eff}$. In other words, $$V_T = f(V_{BS}, N_A, L_{eff}) \qquad (4)$$

Figure 5:
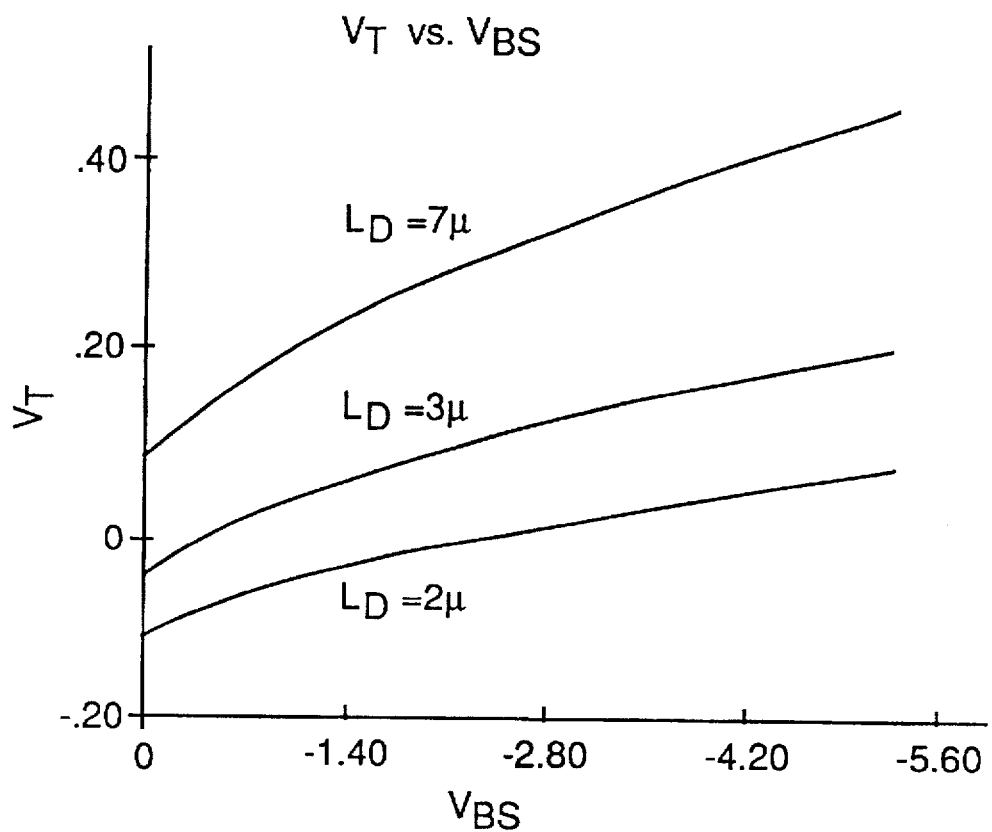
FIG. 5 shows graphically the relationship between the threshold voltage $V_T$ and the back bias voltage $V_{BS}$ for an N-channel native MOS transistor.

FIG. 5 shows graphically the relationship between the threshold voltage $V_T$ and the back bias voltage $V_{BS}$ for an N-channel native transistor. A native transistor is one which has not had its threshold voltage modified through ion implantation of its channel region and thus has a channel region which has the same dopant type and concentration as the substrate. The ordinate of the graph in FIG. 5 is threshold voltage $V_T$ while the abscissa is the back bias $V_{BS}$. FIG. 5 shows that as the back bias increases negatively, the threshold voltage increases monotonically. As the back bias voltage $V_{BS}$ becomes more negative, the threshold voltage $V_T$ increases with at a decreasing, but remains positive.

Moreover, the threshold voltage $V_T$ is more greatly affected by a given change in back bias voltage $V_{BS}$ as the length of the channel between the source and drain becomes larger. FIG. 5 shows $V_T$ vs. $V_{BS}$ for channel lengths $L_D$ of two microns, three microns, and seven microns.

Transistors W1, W2, W3, and W4 are native semiconductor devices. A standard N-type transistor has had its channel implanted to increase the acceptor impurity concentration of its channel and thus is always "off" when $V_{GS}$ (the gate-to-source voltage) equals zero volts and thus is called an "enhancement-only device". However, when $V_{GS}$ of a native N-channel transistor is zero, the device is still conducting. Thus, the device is characterized as "leaky".

Figure 6:
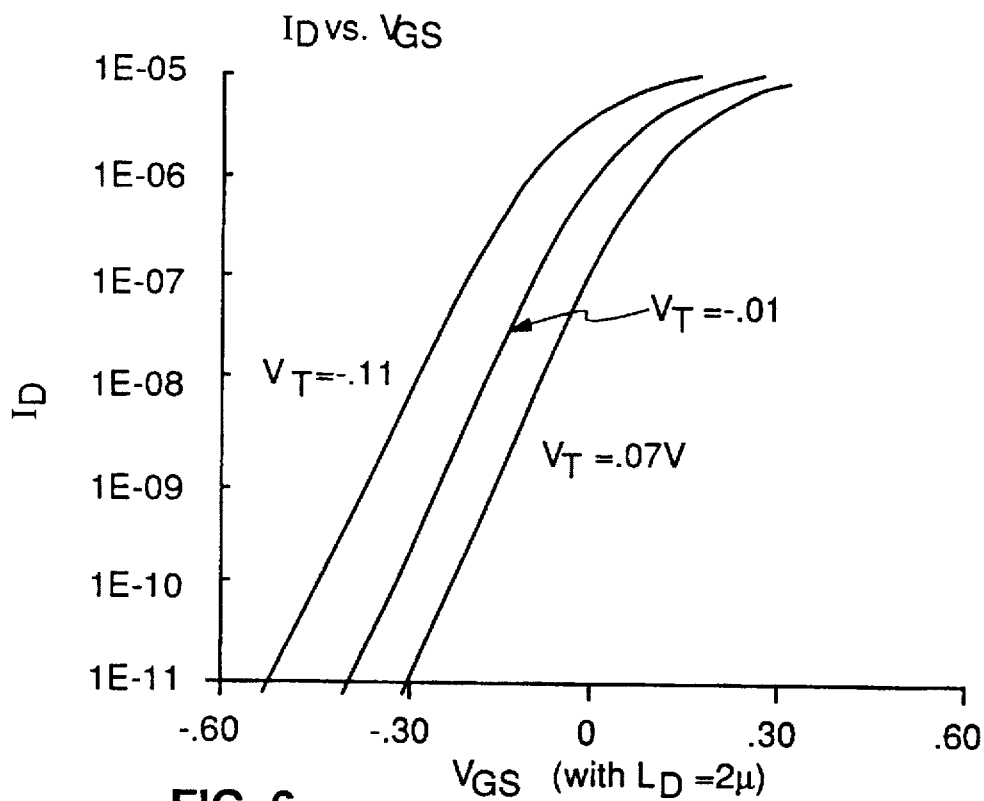
FIG. 6 illustrates the relationship between a given gate to source voltage $V_{GS}$, the drain current $I_D$, and the threshold voltage $V_T$.

As shown in FIG. 6, which is a logarithmic plot of drain current $I_D$ versus gate drive $V_{GS}$ for a native N-channel MOS semiconductor transistor, a small variation in gate drive $V_{GS}$ results in a large variation in the drain current $I_D$. FIG. 6 illustrates three curves of drain current $I_D$ versus gate drive $V_{GS}$. For a threshold voltage $V_T$ approximately equal to zero (i.e. −0.01 volts), the drain current $I_D$ is about $10^{-6}$ amps for gate drive $V_{GS}$ equal to zero. However, if the gate drive $V_{GS}$ is negative, such as −0.4, the drain current $I_D$ drops dramatically to about $10^{-11}$ amps. On the other hand, if the gate to source voltage $V_{GS}$ is positive, such as for example, +0.5 volts, the drain current rises dramatically (off the graph), but at a declining rate with increasing gate-to-source voltage $V_{GS}$. In other words, the rate of increase of the drain current $I_D$ decreases and approaches a saturation level with increasing gate drive $V_{GS}$. Accordingly, the drain current $I_D$ is extremely sensitive to deviations in gate-to-source voltage $V_{GS}$ for a given threshold voltage $V_T$.

FIG. 6 also shows that for a given gate-to-source voltage $V_{GS}$, the drain current $I_D$ varies dramatically with a small change in threshold voltage $V_T$. Thus, for $V_T$ equal to zero at $V_{GS}$ equal to zero, the drain current $I_D$ is about $10^{-6}$ amps. However, at the same $V_{GS}$ for a threshold voltage $V_T$ equal to −0.11, the drain current $I_D$ increases significantly to about $5\times10^{-6}$ amps. On the other hand, for the threshold voltage $V_T$ increasing very slightly to approximately 0.07 volt, the drain current $I_D$ for the same gate-to-source voltage $V_{GS}$ drops dramatically to approximately $2\times10^{-7}$ amps.

A word is in order regarding the leakage current requirement imposed upon pull-up devices W1 and W2 in accordance with this invention. During the programming of the static RAM cell (FIG. 3), one of nodes A or B is driven to a high voltage relative to the other of these nodes. In order to maintain this state, the leakage current through load transistor W1 or W2 to the one of nodes A and B which has the high voltage must be greater than the leakage of current from the one of nodes A and B with the high voltage. For purposes of illustration, node A will be assumed to be at a low voltage, and node B will be assumed to be at a high voltage. The gate of pull-down transistor N1, as will be seen, is at the same level as the voltage on node B, which is high under the assumed state. Therefore, transistor N1 will be turned "on". Accordingly, current will flow from $V_{CC}$ to node C through load transistor W1 and pull-down transistor N1. Further, transistor N1, being an enhancement mode N-channel device, will pass the voltage on node C directly to node A.

However, no current will flow through load transistor W2 and pull-down enhancement-mode transistor N2 because the gate of pull-down transistor N2 is controlled by the low voltage on node A to be "off" for $V_{GS}=0$. Enhancement mode devices, such as N-channel transistors N1 and N2, have had their channel regions selectively implanted to insure that for a gate-to-source voltage $V_{GS}$ equal to zero these devices are "off" (i.e., non-conducting). Typically, transistors N1 and N2 are fabricated to have a 0.5 to 0.8 volt threshold voltage $V_T$. A native device, on the other hand, has a channel region possessing essentially the same dopant concentration as the remainder of the substrate and will be leaky (i.e. pass a small drain current) for a threshold voltage $V_T$ equal zero.

Figure 7:
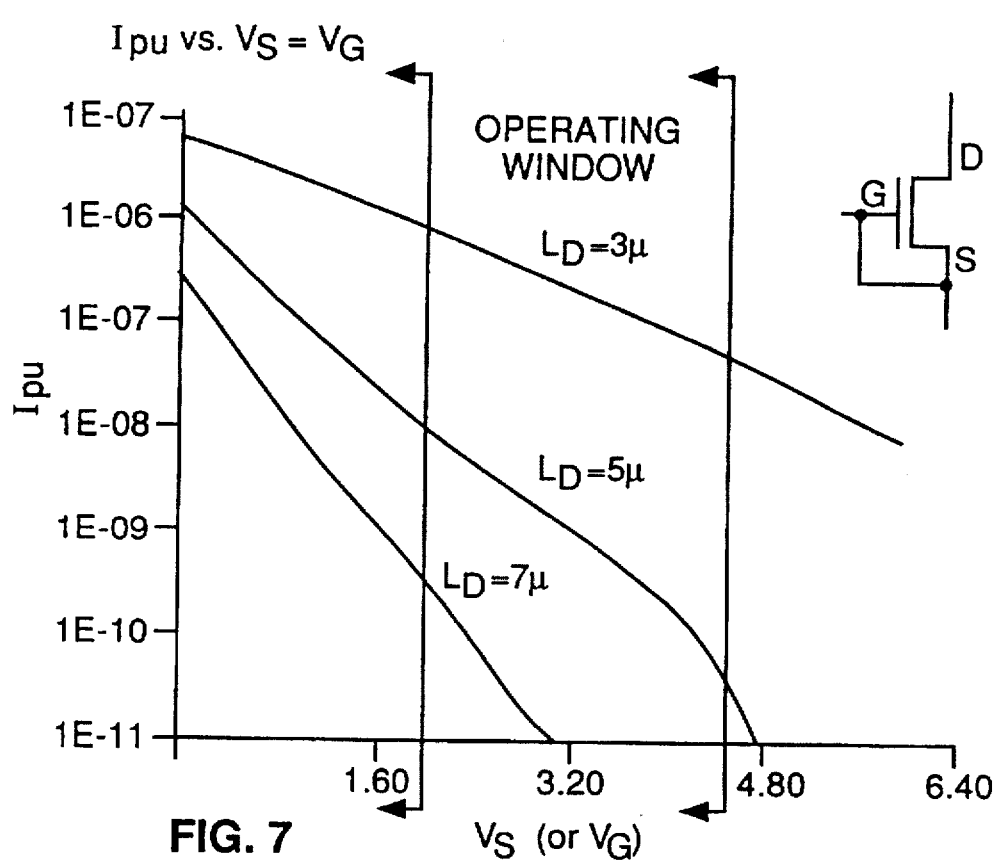
FIG. 7 illustrates the relationship between the pull-up current $I_{pu}$ and the source voltage $V_S$ where the source voltage $V_S$ is equal to the gate voltage $V_G$.

To sustain the high voltage on node B, transistor W2 must supply more pull-up current ($I_{pu}$) to node B than the current which leaks from node B, i.e., junction leakage current to the substrate or leakage currents associated with enhancement mode transistor N2 or pass transistor W4. FIG. 7 illustrates the operating window of source voltage $V_S$ (where $V_S=V_G$ because the source of W2 is connected to its gate, as shown) for various pull-up currents $I_{pu}$ at different channel lengths $L_D$ for load transistor W2 (and by symmetry for load transistor W1). Referring to FIG. 7, if the channel length is 7 microns and the source voltage $V_S$ is zero, then the pull-up current $I_{pu}$ is approximately $3\times10^{-7}$ amps. FIGS. 5, 6, and 7 show values of actual devices where the channel width W is approximately thirty times (30×) the width of the channels in the transistors typically used in the cell of this invention. Because the pull-up current is proportional to the channel width divided by the channel length, obtaining a proper value for the pull-up current for a cell used in this invention requires dividing $I_{pu}$ in FIG. 7 by 30. In one embodiment of this invention, there are 16,000 cells in the device. Hence, $I_{pu}$ must also be multiplied by 16,000. The resulting total pull-up current available on the chip is given by the equation:

$$\Sigma I_{pu} = \frac{3\times10^{-7}}{30} \times 16,000 \text{ or } 160 \text{ }\mu amps \qquad (5)$$

However, devices used in this invention must have a maximum total pull-up current approximating 1 µamp or less. Hence, the total pull-up current $I_{pu}$ of 160 µamps is approximately 160 times too large. Reducing the pull-up current $I_{pu}$ to $1\times10^{-9}$ amps by increasing the source voltage $V_S$ to approximately 1.6 volts yields the following equation for total pull-up current through the memory array:

$$\Sigma I_{pu} = \frac{10^{-9}}{30} \times 16,000 \cong 0.5 \text{ }\mu amps \qquad (6)$$

This total pull-up current for a semiconductor chip containing 16,000 devices is less than 1 βamp and therefore is acceptable for use in the present invention.

The maximum voltage capable of being sustained by the junction associated with node A or B in the memory cell of FIG. 3 is the voltage at which the junction leakage current equals the cell pull-up current $I_{pu}$. Referring to FIG. 7, one sees that 4.8 volts gives a pull-up current $I_{pu}$ of about $10^{-13}$ microamps extrapolating in a straight line manner the line for $L_D$ equals seven (7) microns.

Increasing the temperature will increase the leakage current. Therefore, to ensure the proper leakage current $I_{pu}$ in the memory array, an extra margin of safety is included in the above calculations by increasing the source voltage $V_S$ beyond what is necessary to ensure that the leakage (i.e. pull-up) current $I_{pu}$ is always beneath the specified maximum leakage current.

In accordance with this invention, the pull up currents $I_{pu}$ of load transistors W1 and W2 are controlled by controlling the voltage applied to node C (FIG. 3). Typically, node C in the prior art is connected to a reference voltage, such as ground (see FIG. 1). In accordance with this invention, the voltage applied to node C is programmable to provide the desired leakage current through transistors W1 and W2 to achieve the desired performance characteristics of the SRAM. In particular, the leakage current characteristics of transistors W1 and W2 are determined by controlling the threshold voltage of these transistors by making use of the back bias effect as shown in FIG. 5.

As shown in the circuit of FIG. 3, the gates of transistors W1 and W2 are connected to their sources and thus the drive voltage $V_{GS}$ of these transistors is zero. As shown in FIG. 6, for $V_{GS}=0$, or any value for that matter, an increase in the threshold voltage $V_T$ causes a decrease in drain current $I_D$ which corresponds to the leakage or pull-up current of W1 or W2. FIG. 5 shows that the threshold voltage $V_T$ can be increased by decreasing the substrate bias voltage $V_{BS}$. FIG. 5 shows that a change in $V_{BS}$ from 0 volts to −5.6 volts for the N-channel transistor with $L_D=7\mu$ causes the threshold voltage $V_T$ to increase from about 0.1 to in excess of 0.4 volts. This positive increase in threshold voltage causes the drain current $I_D$ which corresponds to the leakage or pull-up current through transistor W2 to decrease. While the curve in FIG. 6 is drawn for a channel length of two (2) microns a similar curve exists for a channel length of seven (7) microns. Accordingly, by increasing the voltage on node C (FIG. 3) the voltage on the source of W2 is increased thereby making $V_{BS}$ more negative and $V_T$ more positive as shown in FIG. 5, and thus, as shown by FIG. 6, decreasing the leakage current through N-channel transistor W2. Accordingly, the voltage applied to node C in each of the memory cells in the array can be controlled to a selected value and the leakage current through all the cells in the SRAM array can be measured. Then, if the leakage current is too high, the voltage applied to node C can be increased until the total leakage current is less by a selected amount than the total leakage current specified for the SRAM array. This selected amount is chosen to be sufficient to give the SRAM array a leakage current within a desired safety margin such that if the temperature during operation increases thereby causing an increased leakage current, the memory chip is still operating within specification.

Any change in the voltage applied to node C affects the leakage current through both N-channel transistors W1 and W2 in the same manner due to the substantial identical nature of these two transistors.

Of importance, the range of programmable voltages that can be applied to node C is limited by the requirement that transistor N2 be "off" even when maximum noise is applied to node A. Therefore, typically the programmable voltage supply will vary from about 0.2 volts to 2 volts. In particular, while the gate-to-source voltage $V_{GS}$ of each cell in a given semiconductor die can vary a small amount (generally 10-15 millivolts) due to process variations across the die during fabrication, $V_{GS}$ can vary much more from wafer to wafer. Accordingly, the programmability of the voltage on node C is essential to insure that the leakage current through the die as a whole is no greater than the maximum leakage current specified for the static memory array.

Note that the operation of N-channel transistors W3 and W4, which function as pass transistors, is also affected by programming the voltage on node C. Transistors W3 and W4 (FIG. 3) have natural (or native) thresholds, i.e., their thresholds have not been changed through ion implantation. As such, each of these transistors will pass a high voltage from its drain to its source with very slight loss of voltage, typically no more than a 10 percent drop in the voltage.

Pass transistors W3 and W4, when "off," must not conduct. Native semiconductor devices, such as transistor W4, are "off" (i.e. have essentially no leakage current) when $V_{GS}$ is negative by some amount. One method of ensuring an "off" state for transistor W4 is to provide a zero voltage on word line WL and a positive voltage on bit line $\overline{BL}$ to create a negative $V_{GS}$. Typically, a one volt minimum on bit line $\overline{BL}$ with zero volts on word line WL ensures that transistor W4 is "off" and has no leakage current. Consequently, the voltage on node B remains high and does not drop due to excessive leakage current from this node.

Similarly, bit line BL also is held at a minimum voltage of 1 volt or more to insure that pass transistor W3 is also "off."

A problem arises if enhancement mode devices are used for W3 and W4 instead of native transistors. An enhancement mode device has a higher acceptor level $N_A$ in the substrate and thus has a higher threshold voltage $V_T$. Typically, the threshold voltage for an enhancement mode device is approximately 1.5 to 1.7 volts with a high voltage (which functions as a back bias for W3 or W4) on node A or B. The voltage on bit line $\overline{BL}$ capable of being transferred to node B is the voltage on bit line $\overline{BL}$ (which is $V_{CC}$) minus the threshold voltage $V_T$.

For example, assuming the voltage on node A is low and the voltage on node B is high and the voltage on word line WL is zero, the gate to source voltage $V_{GS}$ of transistor W3 is $-V_C$, where $V_C$ is the voltage applied to node C by the programmable voltage supply. The gate to source voltage of W4 to turn on W4 is about 1.5 volts, reflecting the much higher threshold voltage (about 1.5 volts) of an enhancement mode N channel transistor. Thus, with a five volt power supply, node B (A) in a high state would be at about 3.5 volts while node A (B) in a low state would be at the voltage on node C. Therefore, when the programmable voltage supply (FIG. 3) raises the reference voltage on node C to 2 volts, this leaves a noise margin between the high and low states of node B or node A of only about 1.5 volts. A 1.5 volt difference between high and low states is not sufficient to ensure immunity from noise changing the state of the cell. Accordingly, transistors W3 and W4 are made native transistors to achieve a lower threshold voltage $V_T$ (i.e. a threshold voltage in the range of 0.3 to 0.5 volts) and thus a higher voltage on node A or node B when the bit line BL or $\overline{BL}$ is charged to approximately $V_{CC}$. Use of native semiconductor devices for transistors W3 and W4 increases the noise margin by about 1 to 1.2 volts and, therefore, native transistors are preferred for the pass transistors W3 and W4. Accordingly, transistors W3 and W4 are made native transistors to achieve a lower threshold voltage and thus a higher voltage on node B (A) when the bit line $\overline{BL}$ (BL) is charged to approximately $V_{CC}$.

Figure 8:
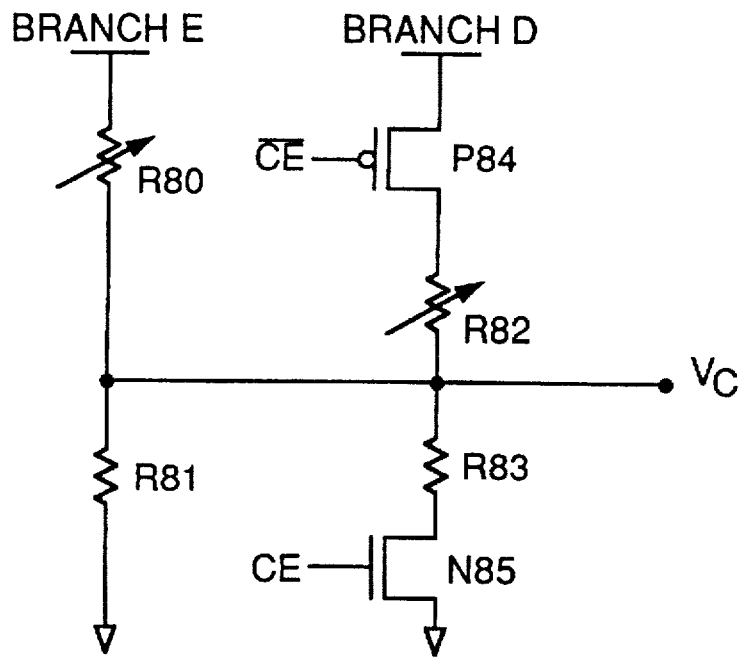
FIG. 8 shows the circuit diagram of the programmable voltage supply which supplies the voltage $V_C$ to node C of the circuit in FIG. 3.

FIG. 8 shows the circuit diagram of the programmable voltage supply. $V_C$ is the voltage applied to node C (FIG. 3). The circuit of FIG. 8 has two modes: active and standby. During the active mode, node C is at a low impedance. In contrast, during the standby mode, node C has a high impedance to guarantee that the leakage current through Branch E for generating the bias level is not too high.

To generate the proper voltage $V_C$, two resistors R82 and R83 are connected in series with P-type transistor P84 and N-type transistor N85, respectively. Transistors P84 and N85 are controlled by chip-enable signals $\overline{CE}$ and CE, respectively. When $\overline{CE}$ is high and CE is low, the circuit is in its standby mode with both P84 and N85 "off" so that no current is flowing through branch D.

However, current will flow through branch E which comprises a programmable resistor RS0 and a fixed resistor R81. In one embodiment of the present invention, programmable resistor R80 has a changeable value from 5MΩ to 50MΩ while resistor RS1 has a fixed value of 5MΩ. Because of these high resistances, the standby branch E presents a high impedance and, thus, has a very low current flow.

When $\overline{CE}$ is low and CE is high, current will flow through branch D and branch E. The circuit is then in its active mode. Because the resistor values in branch D are much less than those in branch E, significantly more current will flow through branch D than through branch E. Hence, the voltage $V_C$ is effectively determined by the current through branch D.

Therefore, in the active mode, the voltage $V_{CC}$ is divided through a resistor chain of R82 and R83. Resistor R83 is a fixed resistor and, in one embodiment, has a value of 1kΩ. Resistor R82 is a programmable resistor with a value varying, for example, from 1kΩ to 10kΩ. The voltage $V_C$ is determined by the following equation:

$$V_C = R83 \times V_{cc}/(R82+R83) \qquad (7)$$

Assuming that $V_{CC}$ is equal to five volts and R82 is 1kΩ, the voltage $V_C$ would be 2.5 volts. If R82 were 10kΩ, the resulting voltage $V_C$ would be approximately 0.45 volts. It logically follows that if the application calls for voltage $V_C$ equal to 0.2 volts, then R82 should be 24 kΩ. Therefore the lowest required voltage $V_C$ effectively determines the highest resistor value necessary for resistor R82.

Figure 9:
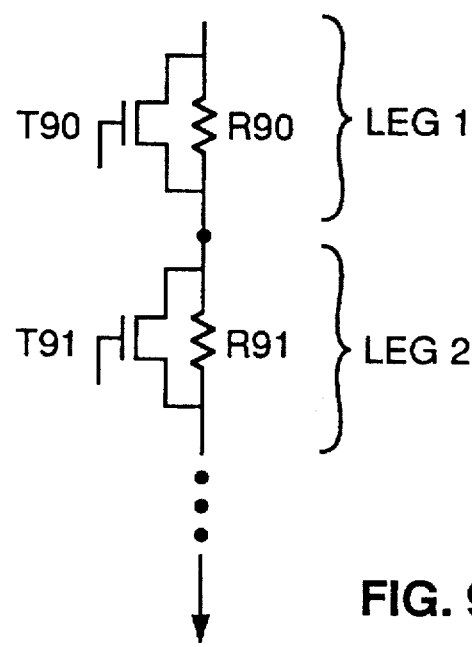
FIG. 9 illustrates a configuration of the programmable resistors R80 and R82 shown in FIG. 8.

FIG. 9 illustrates one configuration of the programmable resistors such as R80 and R82 shown in FIG. 8. Assume, for example, R82 is programmed for loads between 1kΩ and 10kΩ. Then as shown in FIG. 9, the programmable resistor R82 comprises ten legs (leg 1, leg 2, etc.) wherein each leg includes a 1KΩ resistor (R90, R91, etc.). An N-channel transistor (T90, T91, etc.) is then connected in parallel with each resistor. If a transistor is "on" then the parallel resistor is shorted. On the other hand, if a transistor is "off," then the parallel resistor is in series with the other non-shorted resistors.

Figure 10:
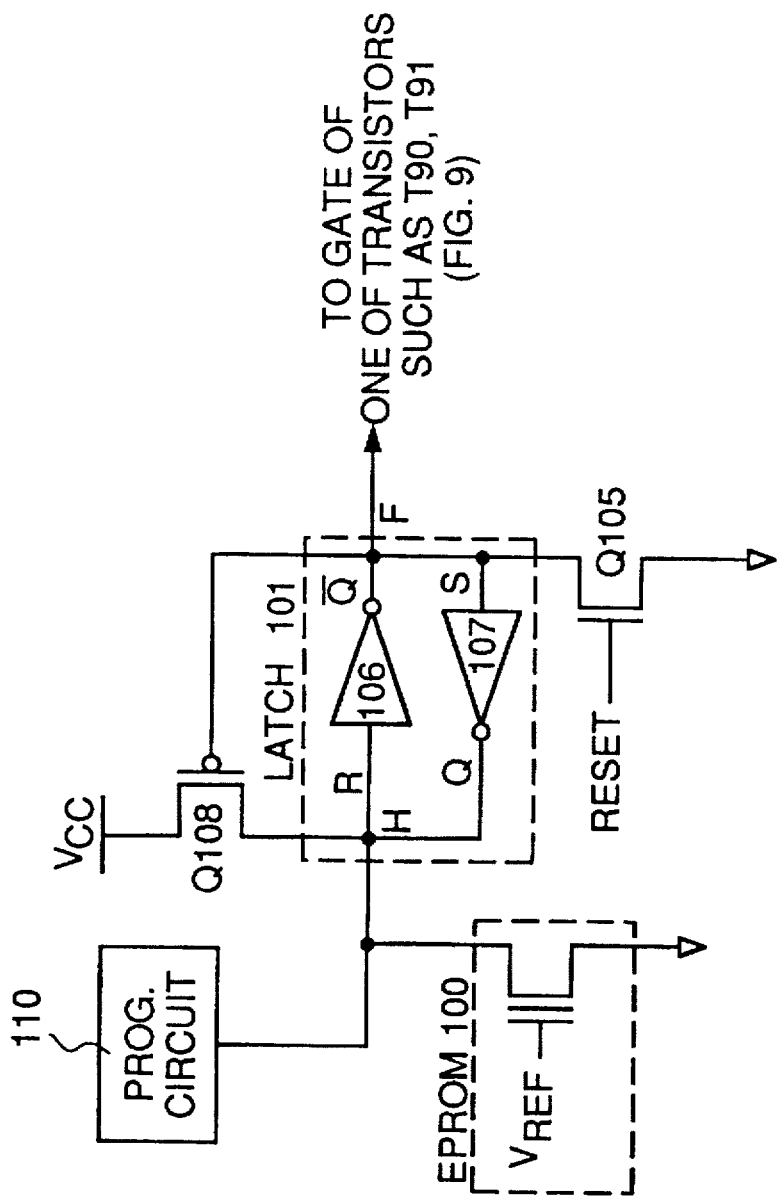
FIG. 10 shows the circuit for programming the gates of the transistors T90 and T91 parallel with the resistors R90 and R91 shown in FIG. 9.

FIG. 10 shows the circuit for programming the gates of the resistors shown in FIG. 9. The circuitry comprises an EPROM 100, a latch 101, and a reset transistor Q105. Node F connects the latch 101 to the gate of an individual transistor (for example, the gate of T90 or T91 of FIG. 9). Each transistor shown in FIG. 9 has an associated latch as shown in FIG. 10 which will provide a voltage of either zero or five volts to its gate.

Latch 101 comprises two inverters 106 and 107. Inverter 107 produces an output value Q that is inverted from its input value S. Output value Q becomes the input value R of invertor 106. Similarly, inverter 106 produces an output $\overline{Q}$ that is inverted from the input value R. Output $\overline{Q}$ becomes the input value S of inverter 107.

When reset transistor Q105 is "on", the gate voltage applied to p-type transistor 108 will be "low", thereby turning "on" transistor Q108 and applying the high voltage $V_{CC}$ to node H and thus to the input lead of inverter 106. It follows that input value S and output value $\overline{Q}$ on node F are "low". Accordingly, in this example, the low voltage (i.e. ground) on node F will be transferred to the gate of one of transistors such as T90, T91 (FIG. 9).

In one embodiment of the present invention, EPROM 100 is programmed to ensure the proper voltage on node F. For example, if EPROM 100 is programmed to be on when $V_{ref}$ is applied to the gate of EPROM 100 then node H is low and input R and output Q will also be "low." Accordingly, input S and output $\overline{Q}$ will be "high," thereby turning "off" p-transistor Q108. Therefore, node F will have a high voltage (i.e., approximately $V_{cc}$).

If, however, EPROM 100 is programmed (by a high voltage of around twelve (12) volts supplied by the programming circuit 110), such that it remains off when $V_{ref}$ is applied to the gate of EPROM 100, then the voltage on node H will be high and the voltage on node F will be low. A low voltage on node F turns on P-type transistor Q108 thereby applying the supply voltage $V_{cc}$ to node H.

Latch 101 consumes essentially zero power. Once reset transistor Q105 is turned on forcing node F of latch 101 low (to ground), then the latch forces the gate of P-type transistor Q108 low thereby turning on the P-channel pull-up transistor Q108 and driving node H high. However no static current flows through latch 101. Consequently, latch 101 has zero power consumption.

Because EPROM 100 has non-volatile memory, if the power is turned off, EPROM transistor 100 together with reset transistor Q105 also allows automatic resetting of the latch 101 when the circuit is powered up again.

As can be can be seen from the above description, by utilizing a programmable voltage supply for each cell in the SRAM of this invention the leakage current through each array is tailored to be less than the leakage current specification for the SRAM array. The invention provides a method and structure to ensure that the SRAM circuit meets product specifications and thereby increases product yield. At the same time, the SRAM of this invention uses a small cell size and avoids the problems associated with the prior art CMOS six transistor memory cell. The performance uncertainties associated with the prior art SRAM's utilizing polycrystalline silicon load resistors are also avoided. At the same time, the cell and SRAM array of this invention are capable of being implemented using semiconductor processes of the type used to manufacture standard CMOS microprocessor and EPROM circuitry. Accordingly, manufacturing economies are achieved using this invention.

What is claimed is:

1. A method of controlling the leakage current through an SRAM cell, wherein the SRAM cell comprises:
   (i) a first and a second transistor connected between a first node and a programmable reference voltage and a second node and said programmable reference voltage, respectively;
   (ii) a third and a fourth transistor connected between said first node and a voltage supply and said second node and said voltage supply respectively;
   (iii) a fifth and a sixth transistor connected between said first node and a first bit line and said second node and a second bit line, respectively;
   (iv) the gate of said second transistor connected to said first node; and
   (v) the gate of said first transistor connected to said second node;

consisting of the steps of:
   1) measuring the leakage current through the cell; and
   2) adjusting the programmable reference voltage to change the leakage current to a desired value.

2. The method in claim 1 further including the step of measuring the leakage current after adjusting the programmable reference voltage to determine that the leakage current is at the desired value.

3. The method of claim 2 wherein the voltage supplied by said programmable reference voltage is in a range from approximately 0.2 V to approximately 2 V.

4. The method of controlling the leakage current through an SRAM containing a plurality of memory cells connected between a voltage source and a reference voltage which comprises:
   measuring the leakage current through the SRAM; and
   adjusting the reference voltage to achieve a desired leakage current through the SRAM.

5. An SRAM comprising:
   a plurality of memory cells;
   means for providing a reference voltage;
   means for connecting said plurality of memory cells between a voltage source and said means for providing a reference voltage; and
   means for programming the means for providing a reference voltage to thereby adjust the reference voltage provided to achieve a desired leakage current through the SRAM.

* * * * *